(12) United States Patent
Ikeda et al.

(10) Patent No.: US 7,669,752 B2
(45) Date of Patent: Mar. 2, 2010

(54) FLUX FOR SOLDERING AND CIRCUIT BOARD

(75) Inventors: Kazuki Ikeda, Kakogawa (JP); Shunsuke Ishikawa, Kakogawa (JP); Takaaki Anada, Kakogawa (JP); Keigo Obata, Akashi (JP); Takao Takeuchi, Akashi (JP); Naoya Inoue, Akashi (JP)

(73) Assignee: Harima Chemicals, Inc., Hyogo (JP)

( * ) Notice: Subject to any disclaimer, the term of this patent is extended or adjusted under 35 U.S.C. 154(b) by 210 days.

(21) Appl. No.: 11/767,194

(22) Filed: Jun. 22, 2007

(65) Prior Publication Data

US 2007/0241170 A1    Oct. 18, 2007

Related U.S. Application Data

(62) Division of application No. 11/024,739, filed on Dec. 30, 2004, now abandoned.

(51) Int. Cl.
    *B23K 31/02*    (2006.01)
(52) U.S. Cl. .............. 228/180.21; 228/180.22; 228/207; 228/223; 228/248.1
(58) Field of Classification Search ............. None
    See application file for complete search history.

(56) References Cited

U.S. PATENT DOCUMENTS

| | | | | |
|---|---|---|---|---|
| 5,127,968 A | | 7/1992 | Gomi | |
| 5,458,907 A | * | 10/1995 | Ishido | ............ 216/13 |
| 5,855,993 A | * | 1/1999 | Brady et al. | ........... 428/209 |
| 6,066,196 A | * | 5/2000 | Kaloyeros et al. | ....... 106/1.18 |
| 6,319,543 B1 | * | 11/2001 | Soutar et al. | ............ 228/176 |
| 6,395,329 B2 | * | 5/2002 | Soutar et al. | ............ 228/176 |
| 6,830,177 B2 | * | 12/2004 | Pai | .............. 228/180.21 |
| 6,853,077 B2 | * | 2/2005 | Oida et al. | ............. 257/738 |
| 6,860,925 B2 | * | 3/2005 | Soutar et al. | ............ 106/1.22 |
| 6,871,775 B2 | * | 3/2005 | Yamaguchi et al. | ....... 228/215 |
| 7,081,404 B2 | * | 7/2006 | Jan et al. | ............... 438/613 |
| 7,259,032 B2 | * | 8/2007 | Murata et al. | ............ 438/26 |
| 7,358,174 B2 | * | 4/2008 | Mis | ...................... 438/612 |
| 2002/0045036 A1 | * | 4/2002 | Gorrell et al. | ............ 428/209 |
| 2003/0159761 A1 | * | 8/2003 | Ikeda et al. | ............... 148/24 |
| 2003/0216025 A1 | * | 11/2003 | Lu et al. | .................. 438/614 |
| 2004/0079194 A1 | | 4/2004 | Nakata | |
| 2004/0209451 A1 | * | 10/2004 | Kukimoto et al. | ......... 438/612 |
| 2005/0048772 A1 | * | 3/2005 | Pan | ....................... 438/672 |
| 2005/0072834 A1 | * | 4/2005 | Zeng | .................. 228/180.22 |
| 2005/0181191 A1 | * | 8/2005 | Ellis et al. | ............... 428/209 |
| 2005/0217757 A1 | * | 10/2005 | Miyano | ................... 148/24 |
| 2006/0032757 A1 | * | 2/2006 | Brevnov et al. | ........... 205/205 |

FOREIGN PATENT DOCUMENTS

JP    2003-236695 A    8/2003
JP    2003-251494 A    9/2003

* cited by examiner

*Primary Examiner*—Kiley Stoner
(74) *Attorney, Agent, or Firm*—Sughrue Mion, PLLC

(57) ABSTRACT

A flux contains resin having film forming ability, activator, solvent and at least one complex selected from silver complex and copper complex. The flux is used when soldering is performed onto a circuit having electroless nickel plating or further having gold plating on the electroless nickel plating. Allowing a barrier layer of silver or copper to deposit on the surfaces of lands suppresses the diffusion of nickel into melted solder alloy during soldering, and also prevents phosphorous concentration. This improves the bonding strength of soldering and suppresses the reduction deposition of silver and/or copper to portions other than circuit patterns.

19 Claims, No Drawings

FLUX FOR SOLDERING AND CIRCUIT BOARD

This is a divisional of application Ser No. 11/024,739 filed Dec. 30, 2004, now abandoned. The entire disclosure of the prior application, application Ser. No. 11/024,739, is hereby incorporated by reference.

BACKGROUND OF THE INVENTION

1. Field of the Invention

The present invention relates to a flux used when soldering various electronic components onto a circuit board, and more particularly to a flux used when soldering is conducted onto copper lands having electroless nickel plating or further having gold plating on the electroless nickel plating, as well as a circuit board.

2. Description of Related Art

Traditionally, when electronic components are generally soldered onto a printed circuit board, soldering to copper lands formed on the printed circuit board has been done by using tin/lead alloy solder and lead-free solder. Generally, to prevent copper oxidation, electroless nickel plating to the surfaces of the lands is conducted in advance, and gold plating to the surface is further conducted in advance by using a nickel plating layer as a barrier layer.

However, since hypophosphite is used as reducing agent in the electroless nickel plating to the above-mentioned lands, a trace quantity of phosphorous is contained in a nickel plating coat. Therefore, when soldering with the use of solder alloy is conducted to the surface of the electroless nickel plating or the surface having the gold plating on the electroless nickel plating, gold and the nickel in the nickel plating diffuse into the melted solder alloy. Then, at the boundaries between the nickel plating layer and the solder alloy, phosphorus segregates locally thereby to produce portions at which phosphorous is extremely concentrated, and in some cases bonding strength is lowered to strip soldering.

As a method for preventing such nickel segregation, the present applicant previously proposed a method of adding various metallic salts into flux (Japanese Patent Laid-Open No. 2003-236695). Specifically, inclusion of metallic salt in flux permits the metal in the metallic salt to be substituted by nickel and deposited. This suppresses the reaction of nickel with the metal in solder alloy, thereby retarding the diffusion of nickel in the surfaces of the lands into the solder alloy.

Unfortunately, when the salts of silver and copper are used as additives to flux, silver or copper is liable to liberate and deposit independently. Therefore, for example, in a soldering method including the steps of printing flux overall onto a substrate having lands, and placing solder balls on the lands and then having the solder balls reflow so as to connect them to the lands, metal deposits from the printed flux and forms a thin metallic film between the lands, Since the metallic film cannot be removed by cleaning, there arises the problem of impairing electrical insulating properties between the lands.

SUMMARY OF THE INVENTION

One advantage of the present invention is to improve the bonding strength of soldering by suppressing the diffusion of nickel into the melted solder alloy during soldering, and to suppress the reduction deposition of silver and/or copper to portions other than a circuit pattern.

A flux of the present invention is particularly used when soldering is performed onto a circuit having electroless nickel plating or further having gold plating on the electroless nickel plating, and contains resin having film forming ability, activator, solvent, and at least one complex selected from silver complex and copper complex. In the present invention. the term "complex" means silver or copper compound having at least one coordinate bond.

The complex in the present invention has no possibility that when heating this, silver or copper independently causes reduction deposition. Instead, the complex deposits due to the substitution by metal that is large in ionization tendency, namely nickel. Hence, it is able to form a barrier layer of silver and/or copper only on the surfaces of the lands, without possibility of forming a thin metallic film between conductor patterns of a substrate, and impairing electrical insulating properties between the lands. The barrier layer of silver and/or copper so formed on the surfaces of the lands suppresses the diffusion of nickel into solder alloy, and prevents the formation of a phosphorous concentrated layer, thereby to improve the bonding strength of the solder.

In other words, a circuit board of the present invention includes lands having on their surfaces electroless nickel plating or further having gold plating on the electroless nickel plating, and a barrier layer of at least one selected from silver and copper to be formed on the surfaces of the lands.

The present invention is also effective in the surface further having gold plating on electroless nickel plating, not only the case of a direct soldering to an electroless nickel plating layer. Specifically, although during soldering, gold plating coat diffuses momentarily into solder alloy, and nickel and solder alloy make direct contact to form the above-mentioned phosphorous concentrated layer, the present invention can prevent this effectively.

In the present invention, silver or copper is substituted by nickel and deposited due to heating at the time of soldering, thus enabling to form a barrier layer on the surfaces of the lands. Therefore, preferably, the complex of the present invention does not cause substitution deposition of silver and copper at temperatures of less than 150° C., and initiates substitution deposition when the temperature is elevated to not less than 150° C. during soldering. Further the complex preferably does not cause metal deposition at portions other than the circuit pattern at temperatures of not more than 280° C., at which it might be exposed during soldering.

A first soldering method of the present invention includes the step of printing or applying the aforesaid flux for soldering onto a substrate having copper lands which have on their surfaces electroless nickel plating or further have gold plating on the electroless nickel plating, and then heating to form a barrier layer of at least one selected from silver and copper on the surfaces of the lands; and the step of placing solder balls on the lands with the barrier layer formed on the surfaces, and then heating to have the solder balls reflow so as to connect them to the lands. From the point of view of environmental impact, solder balls to be used are preferably lead-free Thus, prior to soldering, the flux of the present invention is applied and heated to form a barrier layer on the surfaces of the lands. Thereby, the barrier layer protects the surfaces of the lands, and in the succeeding soldering step, the diffusion of nickel can be prevented to improve bonding strength. In this case, the flux to be used in the soldering step may not be the flux of the present invention.

A second soldering method of the present invention includes the step of printing or applying the aforesaid flux for soldering on a substrate having copper lands which have on their surfaces electroless nickel plating or further have gold plating on the electroless nickel plating; and the step of placing solder balls on the lands and heating to have the solder balls reflow so as to form a barrier layer of at least one selected from silver and copper on the surfaces of the lands, and connect the solder balls via the barrier layer to the lands.

A third soldering method of the present invention includes printing paste that is a mixture of the aforesaid flux for soldering and solder powder, on a substrate having lands which have on their surfaces electroless nickel plating, and then heating to have the paste reflow so as to form solder alloy on the lands.

The present invention also intends to provide a circuit board in which solder is connected by the soldering methods as above described.

Other objects and advantages of the present invention will be apparent from the following detailed description.

DETAILED DESCRIPTION OF THE PREFERRED EMBODIMENTS

A flux of the present invention contains resin having film forming ability, activator, solvent, and at least one complex selected from silver complex and copper complex.

As resin having film forming ability, for example, rosin or thermoplastic acrylic can be used, Acrylic resin has a molecular weight of not more than 10000, preferably 3000 to 8900. When the molecular weight exceeds 10000, cracking resistance and stripping resistance may drop. In order to aid active action, acid value is preferably not less than 50. Softening point is preferably not more than 230° C., because it is necessary that acrylic resin is softened during soldering.

Therefore, examples of suitable acrylic resin are composed from monomers having polymerizing unsaturated group, such as (metha) acrylic acid and ester thereof (e.g., methyl (metha) acrylate, etc.), crotonic acid, itaconic acid, maleic acid(maleic anhydride) and ester thereof, (metha) acrylonitrile, (metha) acrylamide, vinyl chloride, and vinyl acetate. These are preferably polymerized with the use of catalyst, such as peroxide, by radical polymerization such as bulk polymerization method, solution polymerization method, suspension polymerization method, and emulsion polymerization method.

As rosin, it is able to use rosins and derivatives thereof, which have traditionally been used in fluxes. As rosin and derivative thereof, general gum, tall, and wood rosin are usable. Examples of the derivatives thereof are heat treated resin, polymerized rosin, hydrogenated rosin, formylated rosin, rosin ester, rosin modified maleic resin, rosin modified phenol resin, and rosin modified alkyd resin.

The content of resin having film forming ability is in an amount of 20 to 80% by weight, preferably, 30 to 65% by weight Of the total amount of flux. When the content is less than 20% by weight, wettability may deteriorate. On the other hand, when the content is over 80% by weight, viscosity control is impossible and hence operability may deteriorate.

The activator is not particularly limited, for example, amine salt of chlorohydric acid or hydrobromic acid, carboxylic acid or amine salt thereof, etc. Specifically, chlorohydric acid salt or hydrobromic acid salt such as methyl amine, dimethyl amine, trimethyl amine, ethyl amine, diethyl amine, triethyl amine, n-propyl amine, di-n-propyl amine, tri-n-propyl amine, isopropyl amine, diisopropyl amine, triisopropyl amine, butylamine, dibutylamine, monoethanol amine, diethanol amine and triethanol amine, etc.; or organic acids such as oxalic acid, malonic acid, succinic acid, adipic acid, glutaric acid, diethyl glutaric acid, pimelic acid, azelaic acid, sebacic acid, maleic acid, fumaric acid, lactic acid, diglycolic acid, capric acid, laic acid, myristic acid, palmitic acid, linoleic acid, oleic acid, benzoic acid, hydoroxypivalic acid, dimethylolporopionic acid, citric acid, malic acid, glyceric acid, stearic acid, arachic acid, behenic acid and linoleic acid, etc. or amine salt thereof. Alternatively, rosin containing rosin acid is suitably usable as activator.

While the content of activator is not particularly limited, it is preferably in an amount of 0.1 to 30% by weight of the total amount of flux. When the content is less than 0.1% by weight, the function of activator, namely, the active power for removing and cleaning metallic oxide on the metal surface, is insufficient, so that solderability may be lowered. On the other hand, when the content is over 30% by weight, the film forming ability of flux decreases and hydrophilicity increases, so that corrosivity and insulation performance may be lowered. In the case of using rosin so as to perform both functions of resin and activator, the contents of rosin and derivative thereof must be in an amount, within which both functions of these are not impaired.

As solvent, there are, for example, alcohol solvents such as ethyl alcohol, isopropyl alcohol, ethyl cellosolve, butyl carbitol and hexyl carbitol (diethylene glycol monohexyl ether); and ester solvents such as ethyl acetate and butyl acetate; and hydrocarbon solvents such as toluene and turpentine oil.

Solvent is preferably added in an amount of 5 to 70% by weight of the total amount of flux. When the amount of addition of solvent is less than 5% by weight, the viscosity of flux increases, and the applicability of the flux might deteriorate. On the other hand, when the amount of addition of solvent is over 70% by weight, the ratio of effective compositions (e.g., resin) as flux is reduced, so that solderability may be lowered.

A complex in the present invention is preferably one which does not substantially cause substitution deposition of silver and/or copper on a circuit pattern at temperatures of less than 150° C., and causes substitution deposition at temperature of not less than 150° C., and does not substantially cause deposition of silver and/or copper at portions other than the circuit pattern at temperatures of not more than 280° C.

As a complex satisfying such temperature conditions of substitution deposition, there are, for example, complexes of silver ion and/or copper ion and phosphine, nitrogenated heterocyclic compound, or a compound having thiol, thiother or disulfide bond.

As the phosphines, at least one selected from aryl phosphines and alkyl phosphines represented by the following general formula 1. The phosphines can be used alone, or a mixture of two or more of them can be used, general formula 1:

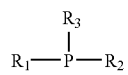

wherein $R_1$, $R_2$ and $R_3$ each represents a substituted or non-substituted aryl group, or a substituted or non-substituted chain or cyclic alkyl group having 1 to 8 carbon atoms; hydrogen of the aryl group may be substituted with an alkyl having 1 to 8 carbon atoms, an alkoxy group having 1 to 8 carbon atoms, a hydroxyl group, an amino group or a halogen atom at any position; hydrogen of the alkyl group may be substituted with an alkoxy group having 1 to 8 carbon atoms, an aryl group, a hydroxyl group, an amino group or a halogen at any position; and $R_1$, $R_2$ and $R_3$ may be the same or different.

As the aryl phosphines, for example, such as triphenyl phosphine, tri(o-, m- or p-tolyl) phosphine and trip-methoxyphenyl) phosphine are suitable. Since as the alkyl phosphines, for example, such as tributyl phosphine, trioctyl phosphine, tris(3-hydroxypropyl) phosphine and tribenzyl phosphine are preferably used.

Among these compounds, triphenyl phosphine, tri(p-tolyl) phosphine, tri(p-methoxyphenyl) phosphine, trioctyl phosphine and tris(3-hydroxypropyl) phosphine are used particularly preferably, and triphenyl phosphine, tri(p-tolyl) phosphine and tri(p-methoxyphenyl) phosphine are used most preferably.

As the nitrogenated heterocyclic compounds, for example, at least one selected from five-ring compound, six-ring compound and derivatives thereof As the nitrogenated five-ring compound, for example, the azoles such as tetrazole, triazole, benzotriazole, imidazole, benzimidazole, pyrazole, indazole, thiazole, benzothiazole, oxazole, benzoxazole, pyrrole, indole and derivatives thereof can be used alone, or a mixture of two or more of them can be used.

Examples of the tetrazole and derivative thereof include tetrazole, 5-aminotetrazole, 5-mercapto-1-methyltetrazole and 5-mercapto-1-phenyltetrazole.

Examples of the triazole, benzotriazole and derivative include 1,2,3-triazole, 1,2,3-triazole-4,5-dicarboxylic acid, 1,2,4-triazole, 3-amino-1,2,4-triazole, 4-amino-1,2,4-triazole, 3-mercapto-1,2,4-triazole, benzotriazole, 5-methyltriazole, tolyltriazole, benzotriazole-5-carboxylic acid, carboxybenzotriazole, 4-aminobenzotriazole, 5-aminobenzotriazole, 4-nitrobenzotriazole, 5-nitrobenzotriazole and 5-chlorobenzotriazole.

Examples of the imidazole, benzimidazole and derivative thereof include imidazole, 1-methylimidazole, 1-phenylimidazole, 2-methylimidazole, 2-ethylimidazole, 2-propylimidazole, 2-butylimidazole, 2-phenylimidazole, 4-methylimidazole, 4-phenylimidazole, 2-aminoimidazole, 2-mercaptoimidazole, imidazole-4-carboxylic acid, benzimidazole, 1-methylbenzimidazole, 2-methylbenzimidazole, 2-ethylbenzimidazole, 2-butylbenzimidazole, 2-octylbenzimidazole, 2-phenylbenzimidazole, 2-trifluoromethylbenzimidazole, 4-metylbenzimidazole, 2-chlorobenzimidazole, 2-hydroxybenzimidazole, 2-aminobenzimidazole, 2-mercaptobenzimidazole, 2-methylthiobenzimidazole, 5-nitrobenzimidazole and benzimidazole-5-carboxylic acid.

Examples of the pyrazole, indazole and derivative thereof include pyrazole, 3-methylpyrazole, 4-methylpyrazole, 3,5-dimethylpyrazole, 3-trifluoromethylpyrazole, 3-aminopyrazole, pyrazole-4-carboxylic acid, 4-bromopyrazole, 4-iodopyrazole, indazole, 5-aminoindazole, 6-aminoindazole, 5-nitroindazole and 6-nitroindazole.

Examples of the thiazole, benzothiazole and derivative thereof include thiazole, 4-methylthiazole, 5-methylthiazole, 4,5-dimethylthiazole, 2,4,5-trimethylthiazole, 2-bromothiazole, 2-aminothiazole, benzothiazole, 2-methylbenzothiazole, 2,5-dimethylbenzothiazole, 2-phenylbenzothiazole, 2-chlorobenzothiazole, 2-hydroxybenzothiazole, 2-aminobenzothiazole, 2-mercaptobenzothiazole and 2-methylthiobenzothiazole.

Examples of the oxazole, benzoxazole and derivative thereof include isoxazole, anthranyl, benzoxazole, 2-methylbenzoxazole, 2-phenylbenzoxazole, 2-chlorobenzoxazole, 2-benzoxazolinone and 2-mercaptobenzoxazole.

Examples of the pyrrole, indole and derivative thereof include pyrrole, 2-ethylpyrrole, 2,4-dimethylpyrrole, 2,5-dimethylpyrrole, pyrrole-2-carboxyaldehyde, pyrrole-2-carboxylic acid, 4,5,6,7-tetrahydroindole, indole, 2-methylindole, 3-methylindole, 4-methylindole, 5-methylindole, 6-methylindole, 7-methylindole, 2,3-dimethylindole, 2,5-dimethylindole, 2-phenylindole, 5-fluoroindole, 4-chloroindole, 5-chloroindole, 6-chloroindole, 5-bromoindole, 4-hydroxyindole, 5-hydroxyindole, 4-methoxyindole, 5-methoxyindole, 5-aminoindole, 4-nitroindole, 5-nitroindole, indole-3-carboxyaldehyde, indole-2-carboxylic acid, indole-4-carboxylic acid, indole-5-carboxylic acid, indole-3-acetic acid, 3-cyanoindole, 5-cyanoindole and carbazole.

As the nitrogenated six-ring compound, for example, pyridine, pyridazine, pyrimidine, pyrazine, triazine, quinoline or phenanthroline and derivatives thereof can be used alone, or a mixture of two or more of them can be used.

Among these compounds, pyridine, 2,2'-bipyridyl, nicotinic acid, pyridazine, pyrimidine, uracil, pyrazine, 1,3,5-triazine, cyanuric acid, quinoline, 8-hydroxyquinoline, isoquinoline and 1,10-phenanthroline are preferably used.

Furthermore, among these compounds, tetrazole, 5-mercapto-1-phenyltetrazole, 1,2,3-triazole, 1,2,4-triazole, 3-mercapto-1,2,4-triazole, benzotriazole, tolyltriazole, carboxybenzotriazole, imidazole, 2-metcaptoimidazole, benzimidazole, 2-octylbenzimidazole, 2-phenylbenzimidazole, 2-mercaptobenzimidazole, 2-methylthiobenzimidazole, pyrazole, indazole, thiazole, benzothiazole, 2-phenylbenzothiazole, 2-mercaptobenzothiazole, 2-methylthiobenzothiazole, isoxazole, anthranil, benzoxazole, 2-phenylbenzoxazole, 2-mercaptobenzoxazole, pyrrole, 4,5,6,7-tetrahydroindole, indole, pyridine, 2,2'-bipyridyl, nicotinic acid, pyridazine, pyrimidine, uracil, pyrazine, 1,3,5-triazine, cyanuric acid, quinoline, 8-hydroxyquinoline, isoquinoline and 1,10-phenanthroline are preferred.

Furthermore, among these compounds, 5-mercapto-1-phenyltetrazole, 3-mercapto-1,2,4-triazole, benzotriazole, tolyltriazole, carboxybenzotriazole, imidazole, benzimidazole, 2-octylbenzirnidazole, 2-mercaptobenzimidazole, benzothiazole, 2-mercaptobenzothiazole, benzoxazole, 2-mercaptobenzoxazole, pyridine, 2,2'-bipyridyl, 8-hydroxyquinoline and 1,10-phenanthroline are particularly preferred.

As the compound having thiol, thiother or disulfide bond, for example, methanethiol, ethanethiol, 1-propanethiol, 1-butanethiol, 3-methyl-1-butanethiol, 2-propene-1-thiol, ethanedithiol, 2-mercaptoethanol, 2,3-dimercapto-1-propanol, 2-aminoehanethiol, benzenethiol, trienethiol, 1,4-benzenethiol, trienedithiol, aminobenzenethiol, phenylmeanethiol, mercaptoacetic acid, 2-mercaptopropionic acid, mercaptosuccinic acid, L-cysteine, methyl sulfide, ethyl sulfide, dibutyl sulfide, divinyl sulfide, diphenyl sulfide, dibenzyl sulfide, dimethyl disulflde, diethyl disulfide, methylpropyle disulfide and dithioglycolic acid can be used alone, or a mixture of two or more of them can be used.

When the complex with the aforesaid silver ion and/or copper ion in the present invention is cationic, counter anion is required. As this counter anion, organic sulfiuric acid ion, organic carboxylic acid ion, halogen ion, nitric acid ion or sulfuric acid ion are suitable, and organic sulfuric acid ion is particularly preferred.

As the organic sulfonic acid used as the counter anions, at least one selected from organic sulfonic acids represented by the following general formulas 2, 3 and 4 are preferably used.

general formula 2:

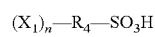

$(X_1)_n$—$R_4$—$SO_3H$ wherein $R_4$ represents an alkyl group having 1 to 18 carbon atoms, an alkenyl group having 2 to 18 carbon atoms or an alkynyl group having 2 to 18 carbon atoms, $X_1$ represents a hydrogen, a hydroxyl group, an alkyl group having 1 to 8 carbon atoms or an alkoxy group, an aryl group, an aralkyl group, a carboxy group or a sulfo group, n represents an integer of 0 to 3, and $X_1$ may be bonded at any position of $R_4$.

general formula 3:

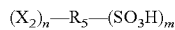

wherein $R_5$ represents an alkyl group having 1 to 18 carbon atoms or an alkylene group having 1 to 3 carbon atoms, and when an alkylene group, a hydroxyl group may be bonded at any position of the alkylene group; $X_2$ represents chlorine and/or fluorine; n represents an integer of not less than 1 and not more than the number of hydrogen capable of bonding with $R_5$, and m represents an integer of 1 to 3. $X_2$ may be bonded with $R_5$ at any position.

general formula 4:

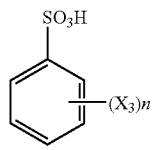

wherein $X_3$ represents a hydroxyl group, an alkyl group having 1 to 18 carbon atoms, an alkoxy group having 1 to 8 carbon atoms, an aryl group, an aralkyl group, an aldehyde group, a carboxyl group, a nitro group, a mercapto group, a sulfo group or an amino group, or two adjacent $X_3$(s) may form a ring to form a naphthalene ring with a benzene ring, and n represents an integer of 0 to 3.

Specific examples of preferred organic sulfonic acid include methanesulfonic acid, methanedisulfonic acid, methanetrisulfonic acid, trifluoromethanesulfonic acid, ethanesulfonic acid, propanesulfoniic acid, 2-propanesulfonic acid, butanesulfonic acid, 2-butanesulfonic acid, pentanesulfonic acid, hexanesulfonic acid, decanesulfonic acid, dodecanesulfonic acid, hexadecanesulfonic acid, octadecanesulfonic acid, 2-hydroxyethanesulfonic acid, 1-hydroxypropane-2-sulfonic acid, 3-hydroxypropane-1-sulfonic acid, 2-hydroxypropane-1-sulfonic acid, 2-hydroxybutanesulfonic acid, 2-hydroxypentanesulfonic acid, 2-hydroxyhexane-1-sulfonic acid, 2-hydroxydecanesulfonic acid, 2-hydroxydodecanesulfonic acid, 1-carboxyethanesulfonic acid, 2-carboxyethanesulfonic acid, 1,3-propanedisulfonic acid, allylsulfonic acid, 2-sulfoacetic acid, 2- or 3-sulfoprppionic acid, sulfosuccinic acid, sulfomaleic acid, sulfofumaric acid, monochloromethanesulfonic acid, trichloromethanesulfonic acid, perchloroethanesulfonic acid, trichlorodifluoropropanesulfonic acid, perfluoroethanesulfonic acid, monochlorodifluoromethanesulfonic acid, trifluoromcthancsulfonic acid, trifluorocthanesulfonic acid, tetrachloropropanesulfonic acid, trichlorodifluoroethanesulfonic acid, monochloroethanolsulfonic acid, dichloropropanolsulfonic acid, monochlorodifluorohydroxypropanesulfonic acid, benzenesulfonic acid, toluenesulfonic acid, xylenesulfonic acid, nitrobenzenesulfonic acid, sulfobenzoic acid, sulfosalicylic acid, benzaldehydesulfonic acid, phenolsulfonic acid, phenol-2,4-disulfonic acid, anisolesulfonic acid, 2-sulfoacetic acid, 2-sulfopropionic acid, 3-sulfopropionic acid, sulfosuccinic acid, sulfomethylsuccinic acid, sulfofumaric acid, sulfomaleic acid, 2-sulfobenzoic acid, 3-sulfobenzoic acid, 4-sulfobenzoic acid, 5-sulfosalicylic acid, 4-sulfophthalic acid, 5-sulfoisophtalic acid, 2-sulfoterephthalic acid and naphthalenesulfonic acid.

Among these organic sulfonic acids, methanesulfonic acid, 2-hydroxyethanesulfonie acid, 2-hydroxypropane-1-sulfonic acid, trichloromethanesulfonic acid, trifluoromethanesulfonic acid, benzenesulfonic acid, toluenesulfonic acid, phenolsulfonic acid, cresolsulfonic acid, anisolesulfonic acid and naphthalenesulfonic acid are used more preferably, and methanesulfonic acid, toluenesulfonic acid and phenolsulfonic acid are particularly preferred.

As the organic carboxylic acid used as the counter anions, for example, monocarboxylic acids such as formic acid, acetic acid, propionic acid, butanoic acid and octanoic acid; dicarboxylic acids such as oxalic acid, malonic acid and succinic acid; hydroxycarboxylic acids such as lactic acid, glycolic acid, tartaric acid and citric acid; and halogen-substituted carboxylic acids such as monochloroacetic acid, dichloroacetic acid, trichloroacetic acid, trifluoroacetic acid and perfluoropropionic acid are preferably used.

Among these organic carboxylic acids, formic acid, acetic acid, oxalic acid, lactic acid, trichloroacetic acid, trifluoroacetic acid and perfluoropropionic acid are preferred, and acetic acid, lactic acid and trifluoroacetic acid are particularly preferred.

In the present invention, complexes of silver ion and/or copper ion and phosphines, nitrogenated heterocyclic compound, or a compound having thiol, thioether or disulfide bond can also be used independently, or may be used by mixing two or more types.

As for complexing agent for forming the aforesaid complex with silver or copper, only complexing agent can further be added besides the aforesaid complex, in order to further stabilize flux.

The flux of the present invention can be manufactured by mixing the respective compositions as above described, and then melting while heating. The flux of the present invention may contain other compositions such as thixotropy imparting agent, in addition to the above-mentioned compositions. As thixotropy imparting agent, there are, for example, hydrogenated castor oil (hardened castor oil), beeswax, carnauba wax, amide stearate, and hydroxy ethylene stearate bisamide. The content of thixotropy imparting agent is preferably in an amount of 1.0 to 25% by weight of the total amount of flux.

Additionally, the flux of the present invention may be used together with synthetic resin such as polyester resin, phenoxy resin, and terpene resin, which have heretofore been known and used as base resin of flux. It is also able to further add various additives such as antioxidant, fungicide, and delustering agent.

The flux of the present invention is particularly suitably used in cases where electroless nickel plating to the lands of a substrate is conducted in advance, or gold plating to the electroless nickel plating is also conducted in advance. While no limitations are imposed on the metal of the lands, to which electroless nickel plating is conducted, copper is preferred.

Although no limitations are also imposed on the type of solder alloy employed in soldering, general tin/lead alloy solder is usable. Alternatively, there may be used so-called lead-free solder in which metal such as silver, zinc, bismuth, indium, or antimony is mixed with tin that is used as base.

In accordance with the first soldering method of the present invention, first, the above-mentioned flux is printed lay screen printing etc. or applied on a substrate having lands which have on their surfaces electroless nickel plating or farther have gold plating on the electroless nickel plating, and then heating to form a barrier layer of silver and/or copper on the surfaces of the lands. Heating temperature is preferably 150° C. to 280° C.

Subsequently, solder balls are placed on the lands and then heated to have the solder balls reflow so as to connect the solder balls to the lands. From an environmental standpoint, the solder balls are preferably formed of lead-free solder as described above. The reflow of solder balls is done by preheating at, for example, 150 to 200° C., and then heating at 170 to 280° C., or alternatively, by directly heating without preheating. Printing and reflow may be carried out in the atmosphere of air, or in the atmosphere of an inert gas such as nitrogen, argon, and helium.

In accordance with the second soldering method, first, the above-mentioned flux is printed or applied on a substrate having copper lands which have on their surfaces electroless nickel plating or further have gold plating on the electroless nickel plating. Subsequently, solder balls are placed on the lands and then heated to have the solder balls reflow so as to form a barrier layer of silver and/or copper on the surfaces of the lands, and connect the solder balls via the barrier layer to the lands. The conditions of reflow are based on the first soldering method, In accordance with the third soldering method, paste that is a mixture of the above-mentioned flux and solder powder is printed on a substrate having lands which have on their surfaces electroless nickel plating or further have gold plating on the electroless nickel plating, and then heated to have the paste reflow so as to form solder alloy on the lands. The reflow temperature of the solder balls is preferably 150° C. to 280° C. This enables to form solder alloy on the lands, via a barrier layer of silver and/or copper, on the surfaces of the lands.

In either case, the barrier layer to be formed is composed of a metallic layer of silver and/or copper, which is substituted by nickel in the aforesaid electroless nickel plating and deposited. The flux may be printed overall on the substrate surface.

Alternatively, in the present invention, paste that is a mixture of the above-mentioned flux for soldering and solder powder may be printed on a substrate having copper lands which have on their surfaces electroless nickel plating or further have gold plating on the electroless nickel plating, and then heated to have the paste reflow so as to form solder alloy on the lands.

Examples of the present invention will be described below. It is understood, however, that the examples are for the purpose of illustration and the invention is not to be regarded as limited to any of the specific materials or condition therein.

EXAMPLES

[Silver or Copper Compound]

As silver or copper compounds, the following materials were selected.

A, $[Ag\{P(C_6H_5)_3\}_4]^+ CH_3SO_3^-$
B: $[Ag]^+ C_6H_4N_3^-$
C: $[Ag]^+ C_2H_2N_3S^-$
D: $[Cu\{P(C_6H_5)_3\}_3]^+ CH_3SO_3^-$
E: $[Cu]^+ C_6H_4N_3^-$
F: $[Cu]^+ C_2H_2N_3S^-$

COMPARATIVE EXAMPLES

G: $C_7H_{15}COOAg$
H: $(C_7H_{15}COO)_2Cu$

[Preparation of Silver or Copper Compound Mixed Flux]

With the use of a triple-roll, the previously selected silver or copper compound and base flux (RMA flux) were mixed uniformly to prepare silver or copper compound mixed flux. The composition of the used base flux were as follows:

| WW class tall rosin | 70 parts by weight |
| Hexyl carbitol | 25 parts by weight |
| Hydrogenated castor oil | 4.8 parts by weight |
| Isopropyl amine HCl | 0.2 parts by weight |

The mixing ratios of the type of silver or copper compounds and RMA flux are indicated in Table 1. The mixing amounts of the respective compositions are expressed in % by weight.

TABLE 1

| | RMA Flux | Silver or Copper Compound |
|---|---|---|
| Flux 1 | 100 | — |
| Flux 2 | 90 | A: 10 |
| Flux 3 | 90 | B: 10 |
| Flux 4 | 90 | C: 10 |
| Flux 5 | 90 | D: 10 |
| Flux 6 | 90 | E: 10 |
| Flux 7 | 90 | F: 10 |
| Flux 8 | 90 | G: 10 |
| Flux 9 | 90 | H: 10 |

Experimental Example 1

The respective fluxes in Table 1 were printed overall and in a thickness of 100 μm on a tandem-pattern substrate, and heated by using reflow profile whose maximum temperature was 250° C. The substrate was then immersed in an ultrasonic washer filled with butyl carbitol solution of 60° C., to remove the flux. Then, insulating resistance was measured after leaving it for 168 hours in an atmosphere having a temperature of 85° C. and a relative humidity of 85%, while applying a voltage of DC50V to the substrate (Based on the test method of JIS Z3197).

Experimental Example 2

Lands were formed on a substrate, which were 0.4 mm in diameter and had nickel electroless plating to copper and further had gold flash plating thereon, and the respective fluxes in Table 1 were printed overall and in a thickness of 100 μm on the substrate. Then, solder balls of tin-37 lead having a diameter of 0.4 mm were placed on the lands, and allowed to reflow at 220° C. so as to connect the solder balls to the lands. Subsequently, the substrate was immersed in an ultrasonic washer filled with butyl carbitol solution of 60° C., to remove the flux.

Thereafter, with regard to resist portions in the vicinity of en electrode pattern, elemental analysis with an energy dispersive X-ray fluorescence analyzer (EDX) was conducted to examine the presence or absence of the reduction deposition of the metal of silver or copper.

In addition, with regard to the soldered portions of the soldered substrate, tension test was conducted to measure bonding strength (DAGE-SERIES-4000P, manufactured .by DAGE Incorporation was used). The measurement was made 30 times per flux, and the average was used as bonding strength, and the minimum value was used as minimum bonding strength.

[Test Results]

The results of the foregoing tests are shown in Table 2.

TABLE 2

| Flux | Example 1 Insulating Resistance | Example 2 | | |
|---|---|---|---|---|
| | | Reduction Deposition | Bonding Strength (N) | Minimum Bonding Strength |
| 1 | $1.3 \times 10^{12}$ Ω | nothing | 12.6 | 5.5 |
| 2 | $1.8 \times 10^{12}$ Ω | nothing | 15.3 | 12.3 |
| 3 | $1.5 \times 10^{11}$ Ω | nothing | 14.5 | 12.8 |
| 4 | $1.7 \times 10^{11}$ Ω | nothing | 14.8 | 12.6 |
| 5 | $2.3 \times 10^{12}$ Ω | nothing | 16.1 | 13.8 |
| 6 | $2.7 \times 10^{12}$ Ω | nothing | 15.1 | 12.2 |
| 7 | $1.9 \times 10^{12}$ Ω | nothing | 15.8 | 13.3 |
| 8 | $<1 \times 10^{6}$ Ω | presence | 14.5 | 11.8 |
| 9 | $<1 \times 10^{6}$ Ω | presence | 14.1 | 11.5 |

As apparent from Table 2, in the cases of using Flux 2 to Flux 7, no metal was detected at the resist portions other than the electrode pattern, and no drop in insulating resistance was observed. Also, as for bonding strength, the average bonding strength increases, and such an extremely low bonding strength as in the case of connecting with Flux 1 as not observed, resulting in small variations of bonding strength.

Whereas in Flux 8 and Flux 9, which used octanoic acid silver and octanoic acid copper, silver or copper caused substitution deposition at the nickel portion of the lands, and metallic silver or metallic copper was deposited due to reduction deposition, and this was detected, as foreign matter, over the entire surface of an application portion, so that insulating resistance was lowered remarkably.

Also in the case of individually printing per pad, from the fact that silver or copper was detected in the vicinity of the pad due to heating droplet during reflow it is clear that the insulating properties between the electrode patterns will be impaired.

What is claimed is:

1. A soldering method, comprising the steps of:

printing or applying a flux for soldering onto a substrate having copper lands which have on their surfaces electroless nickel plating or farther have gold plating on said electroless nickel plating, and heating to form a barrier layer of at least one selected from silver and copper on the surfaces of said lands; and placing solder balls on said lands with said barrier layer formed on their surfaces, and heating to have said solder balls reflow so as to connect said solder balls to said lands, wherein the flux for soldering comprises a resin having film forming ability, an activator, solvent, and at least one complex selected from silver complex and copper complex.

2. A soldering method, comprising the steps of:

printing or applying a flux for soldering onto a substrate having copper lands which have on their surfaces electroless nickel plating or farther have gold plating on said electroless nickel plating; and placing solder balls on said lands, and heating to have said solder balls reflow so as to form on the surfaces of said lands a barrier layer of at least one selected from silver and copper, and connect said solder balls via said barrier layer to said lands, wherein the flux for soldering comprises a resin having film forming ability, an activator, solvent, and at least one complex selected from silver complex and copper complex.

3. The soldering method according to claim 1, wherein said solder balls are lead-free.

4. A soldering method, comprising:

printing paste, which is a mixture of a flux for soldering and solder powder, on a substrate having copper lands that have on their surfaces electroless nickel plating or further have gold plating on said electroless nickel plating, and then heating to have said paste reflow so as to form a barrier of at least one selected from silver and copper, and to form solder alloy on said lands via said barrier layer, wherein the flux for soldering comprises a resin having film forming ability, an activator, solvent, and at least one complex selected from silver complex and copper complex.

5. The soldering method according to claim 1, wherein the reflow temperature of said solder balls is 150° C. to 280° C.

6. The soldering method according to claim 3, wherein the reflow temperature of said solder balls is 150° C. to 280° C.

7. The soldering method according to claim 2, wherein said solder balls are lead-free.

8. The soldering method according to claim 2, wherein the reflow temperature of said solder balls is 150° C. to 280° C.

9. The soldering method according to claim 2, wherein said complex does not substantially cause substitution deposition of at least one selected from silver and copper on a circuit pattern at temperatures of less than 150 ° C., and causes substitution deposition at temperatures of not less than 150° C.

10. The soldering method according to claim 9, wherein said complex does not substantially cause deposition of at least one selected from silver and copper at portions other than a circuit pattern at temperatures of not more than 280 ° C.

11. The soldering method according to claim 2, wherein said complex comprises a complex of silver ion and/or copper ion and phosphine, nitrogenated heterocyclic compound, or a compound having thiol, thioether or disulfide bond.

12. The soldering method according to claim 11, wherein said complex comprises the complex of silver ion and/or copper ion and phosphine, and said phosphine comprises aryl phosphine or alkyl phosphine represented by the following general formula 1 general formula 1:

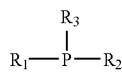

wherein $R_1$, $R_2$ and $R_3$ each represents a substituted or non-substituted aryl group, or a substituted or non-substituted chain or cyclic alkyl group having 1 to 8 carbon atoms; hydrogen of the aryl group may be substituted with an alkyl having 1 to 8 carbon atoms, an alkoxy group having 1 to 8 carbon atoms, a hydroxyl group, an amino group or a halogen atom at any position; hydrogen of the alkyl group may be substituted with an alkoxy group having 1 to 8 carbon atoms, an aryl group, a hydroxyl group, an amino group or a halogen atom at any position; and $R_1$, $R_2$ and $R_3$ may be the same or different.

13. The soldering method according to claim 12, wherein said aryl phosphine or alkyl phosphine comprises triphenyl phosphine, tri(p-tolyl) phosphine, tri(p-methoxyphenyl) phosphine, trioctyl phosphine, or tris(3-hydroxypropyl) phosphine.

14. The soldering method according to claim 11, wherein said complex comprises the complex of silver ion and/or copper ion and a nitrogenated heterocyclic compound, and said nitrogenated heterocyclic compound comprises at least one selected from the group consisting of five-ring compound, six-ring compound and derivatives thereof.

15. The soldering method according to claim 11, wherein said complex contains organic sulfonic acid ion, organic carboxylic acid ion, halogen ion, nitric acid ion or sulfuric acid ion as a counter anion.

16. The soldering method according to claim 15, wherein said complex contains organic sulfonic acid ion as the counter anion, and said organic sulfonic acid comprises at least one selected from the group consisting of organic sulfonic acids represented by the following general formulas 2, 3 or 4 general formula 2:

$(X_1)_n\text{-}R_4\text{-}SO_3H$ wherein $R_4$ represents an alkyl group having 1 to 18 carbon atoms, an alkenyl group having 2 to 18 carbon atoms or an alkynyl group having 2 to 18 carbon atoms, $X_1$ represents a hydrogen, a hydroxyl group, an alkyl group having 1 to 8 carbon atoms or an alkoxy group, an aryl group, an aralkyl group, a carboxyl group or a sulfo group, n represents an integer of 0 to 3, and $X_1$ may be bonded at any position of $R_4$;

general formula 3:

$(X_2)_n\text{—}R_5\text{—}(SO_3H)_m$ wherein $R_5$ represents an alkyl group having 1 to 18 carbon atoms or an alkylene group having 1 to 3 carbon atoms, and when an alkylene group, a hydroxyl group may be bonded at any position of the alkylene group; $X_2$ represents chlorine and/or fluorine; n represents an integer of not less than 1 and not more than the number of hydrogen capable of bonding with $R_5$; and m represents an integer of 1 to 3; $X_2$ may be bonded with $R_5$ at any position;

general formula 4:

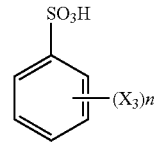

wherein $X_3$ represents a hydroxyl group, an alkyl group having 1 to 18 carbon atoms, an alkoxy group having 1 to 8 carbon atoms, an aryl group, an aralkyl group, an aldehyde group, a carboxyl group, a nitro group, a mercapto group, a sulfo group or an amino group, or two adjacent $X_3$(s) may form a ring to form a naphthalene ring with a benzene ring, and n represents an integer of 0 to 3.

17. The soldering method according to claim 15, wherein said complex contains organic carboxylic acid ion as the counter anion, and said organic carboxylic acid is at least one selected from the group consisting of formic acid, acetic acid, oxalic acid, lactic acid, trichloroacetic acid, trifluoroacetic acid and perfluoropropionic acid.

18. The soldering method according to claim 1, wherein said complex comprises a complex of silver ion and/or copper ion and phosphine, nitrogenated heterocyclic compound, or a compound having thiol, thioether or disulfide bond.

19. The soldering method according to claim 4, wherein said complex comprises a complex of silver ion and/or copper ion and phosphine, nitrogenated heterocyclic compound, or a compound having thiol, thioether or disulfide bond.

* * * * *